May 16, 1967 M. N. GLICKMAN 3,320,351

MINIATURE CIRCUIT HOUSING

Filed Jan. 29, 1965

INVENTOR
MANNES N. GLICKMAN
BY Samuel Lindenberg
Abraham Wasserman
ATTORNEYS

United States Patent Office 3,320,351
Patented May 16, 1967

3,320,351

MINIATURE CIRCUIT HOUSING

Mannes N. Glickman, 3145 Lombardy Road, Pasadena, Calif. 91107

Filed Jan. 29, 1965, Ser. No. 428,963
7 Claims. (Cl. 174—50.5)

The present invention relates to circuit enclosures and, more particularly, to an improved housing for miniature components or circuits.

The size of components and circuits used in newly developed electronic systems and devices has been greatly reduced in recent years. At present, various circuits are available in miniature form as integrated circuits, or as thin films on which circuit components are deposited. In all such newly developed circuits which hereinafter will be generally referred to as miniature circuits, extreme care must be directed to properly insulating the various miniature components, as well as the small leads used to interconnect the miniature circuit, with other circuits or parts which together comprise the complete electronic system or apparatus.

The requirements to adequately electrically insulate a plurality of small components from one another, as well as, electrically separate conducting metallic leads, and yet the entire arrangement cannot occupy more than a very small space, creates structural problems which the prior art has not solved. Generally, in presently known miniature circuits thin layers or wafers of insulating material such as glass are alternately used between the components or to metallic leads. However, due to the weak adhesive or bonding characteristics between thin films or glass and metal, the structural stability of such miniature circuits is quite limited. As soon as the circuits are subjected to external physical forces, the circuits become structurally weak, often resulting in short circuiting parts of the circuit and its eventual destruction. Thus, even though presently known miniature circuits operate satisfactorily from an electronic point of view, their structural instability which so far has not been adequately solved, is a basic reason why such miniature circuits have not been used as extensively as expected when they were first developed.

Attempts to metallize glass and thereby increase the bonding effect between the glass and the metallic layers have been unsuccessful. This is mostly due to the practical difficulties in metallizing glass with uniform results. Similar practical difficulties exist in attempting to uniformly metallize other electrically insulating materials, such as ceramic. Although ceramic is easily metallized, continuity of the metallized ceramic surface is not uniformly obtained. Consequently, when such a technique is employed, the metallized ceramic surfaces must be checked for metallic continuity or after brazing by conducting generally expensive and time consuming mass spectrometric tests for vacuum tightness.

Accordingly, it is an object of the present invention to provide a novel housing arrangement which greatly increases the structural stability of miniature circuits encased therein.

Another object of the invention is to provide a novel, structurally rigid housing for a miniature circuit or component, with a plurality of insulated metallic leads extending through the housing to interconnect the encased miniature circuit to external terminals or components.

A further object of the invention is the provision of a novel, and inexpensive miniature circuit housing in which the miniature circuit hermetically sealed, thus providing it with a high degree of overall structural stability.

These and other objects of the invention are achieved in a miniature housing which comprises a metallic frame, through which a plurality of insulated miniature leads protrude through a glass insulation which is fused to the metallic frame. The inside dimension of the miniature housing is made large enough to accommodate a particular miniature, circuit or component to be encased therein. The top and bottom of the housing which are initially opened provide sufficient means for properly encasing the circuit, as well as performing the necessary connections between the circuit and the metallic leads projecting into the frame. Thereafter, the frame is hermetically sealed on the top and bottom by any known methods, such as hot or cold welding, soldering, glass-to-glass or glass-to-metal sealing.

The surface of the metallic frame can be soldered, to or brazed so that the miniature housing may be ideally coupled to the rest of the circuitry of which the encased miniature circuit comprises one part. In addition, the insulated metallic leads are rigidly coupled to the frame or housing by means of the fused glass insulation so that considerable tension forces may be applied to the leads without adversely affecting the encased miniature circuit or hermeticity. The size of the novel housing is held to be very small so that the advantages gained by the miniatureness of the circuit are retained.

The novel features that are considered characteristic of this invention are set forth with particularity in the appended claims. The invention itself both as to its organization and method of operation, as well as additional objects and advantages thereof, will best be understood from the following description when read in connection with the accompanying drawings, in which:

Figure 1:
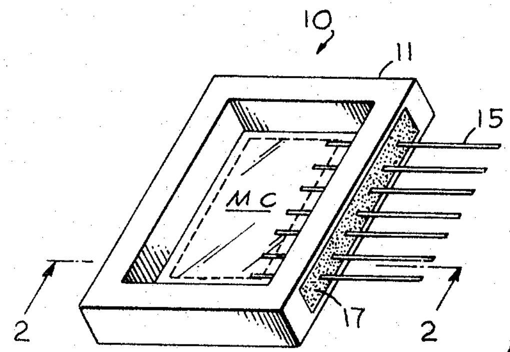
FIGURE 1 is a perspective view of one embodiment of the novel housing of the present invention.

Reference is now made to FIGURE 1 which is a perspective view of one embodiment of the housing of the invention. A housing 10 comprises a box-like metallic frame 11 with the top and bottom thereof being open. A plurality of metallic leads 15 protrude into the space surrounded by the frame 11 through an insulating material such as a glass seal 17, which is fused into the frame, thus, electrically insulating the leads thereform. The frame 11 is shown as having a substantially rectangular shape. However, the frame can have other shapes such as square or round.

The space surrounded by the frame 11 is utilized to house a miniature circuit, generally designated M.C., which is electrically coupled to the protruding portions of the plurality of metallic leads 15. After properly mounting the miniature circuit M.C. the top and bottom of the frame 11 may be covered by metallic or ceramic covers, so that the miniature circuit is sealed within the metallic frame 11.

Figure 2:
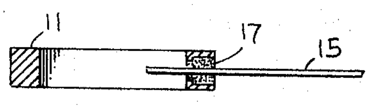
FIGURE 2 is a cross-sectional view of the embodiment of the invention taken along the lines 1—1 of FIGURE 1.

As previously explained, the metallic leads 15 to which the miniature circuit M.C. is electrically connected are electrically insulated from the metallic frame 11 by means of a glass insulator or seal 17. As seen from FIGURE 2 to which reference is made herein, the glass seal 17 is encased within a C-shaped structure of the frame 11, with the leads 15 protruding into the space surrounded by the frame through the glass seal 17. The C-shaped structure of the frame 11 provided excellent support for the glass seal. After inserting the leads 15 through the glass seal, the latter is fused to the metallic surfaces of both the frame 11 and the leads 15. As a result, the leads and the frame become physically bonded even though they are electrically insulated from one another.

The fusing process is controlled to insure the proper oxidation of both the glass material and the metallic material of the C-shaped structure and the leads 15. The controlled oxidation of these materials provides a physically strong hermetic bonding or sealing between the materials. Consequently, the metallic leads to which the miniature circuit is connected form an integral part of the metallic housing which can withstand severe physical environments.

It is thus seen that whereas an unprotected miniature circuit is most sensitive to various physical phenomena which often destroy the circuit, by encasing it within a metallic housing through which insulated electrical leads which are an integral part of the housing protrude, the circuit is protected. Since the housing frame within which the leads are hermetically sealed is metallic it may be covered by metallic or other material so as to form a hermetically sealed housing for the miniature circuit encased therein to further protect the circuit from adverse physical conditions.

Figure 3:
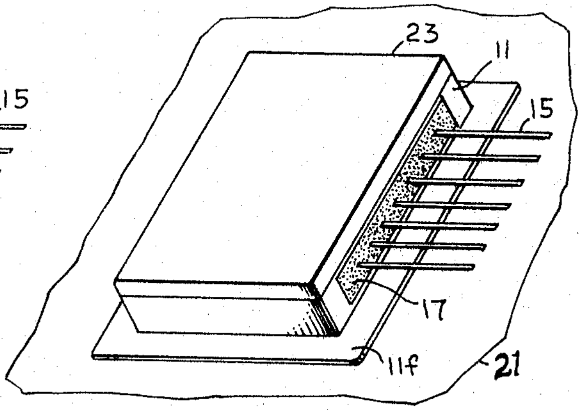
FIGURE 3 is a perspective view of a mounting arrangement useful in explaining the advantages of the present invention.

Reference is now made to FIGURE 3 which is a perspective view of one arrangement useful in explaining the advantages of the present invention. As seen in FIGURE 3, the frame 11 may also include a flange **11*f* so that the frame may be more conveniently mounted on or incorporated in the rest of the circuitry of which the miniature circuit M.C. is only one part. For example, the metallic flange 11*f* may be soldered projection welded or brazed to a high conductivity material 21. Similarly, the material 21 may be an insulated board on which other components are mounted. After properly connecting the miniature circuit M.C. with the frame 11 to the leads 15 by techniques such as soldering or spot welding, thermocompression bonding, the frame may be covered by a cover plate 23. The plate 23 which may be metallic but not limited thereto, is bonded to the frame 11** so that the miniature circuit M.C. is hermetically sealed within the housing.

Figure 4:
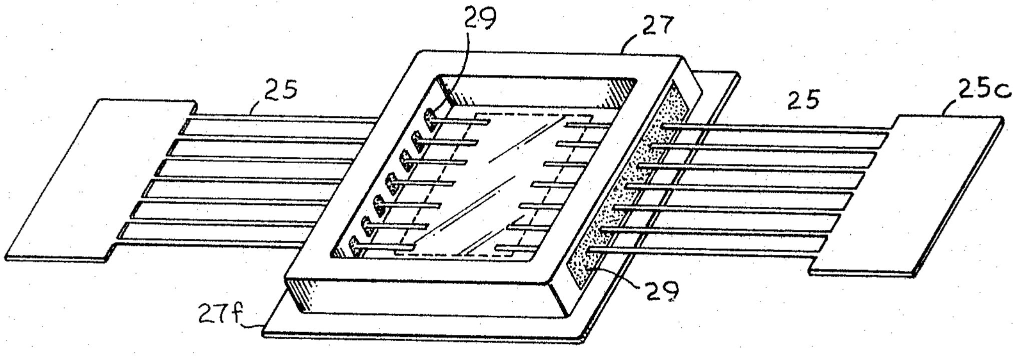
FIGURE 4 is a perspective view of another embodiment of the housing of the invention.

In the foregoing description, the invention is described in conjunction with a housing having a rectangularly shaped frame and wherein the leads 15 protrude through one side of the frame. However, the invention is not limited thereto. Reference is now made to FIGURE 4 which is a perspective view of another embodiment of the invention. Therein, the housing is shown as comprising a square shaped frame 27 having a flange **27*f*, with metallic leads 25 protruding into the space surrounded by the frame 11 through opposite sides thereof. Similar to the rectangularly shaped housing hereinbefore described, each set of leads 25 is insulated from the frame 27 by means of glass seals 29 which are fused to the frame 27** within C-shaped portions thereof. The novel housing of the invention may comprise a frame of any desired geometric configuration. Also, the leads connecting the miniature circuit may protrude into the housing through one or more C-shaped structures of the frame.

In order to control the leads 25 during the process of fusing the glass seals 29 as hereinabove explained, the leads 25 are preferably formed as parts of a comb-like structure **25*c*. Thus, the leads are initially a part of a unitary structure, which may be properly positioned with respect to the frame 27** during the fusing process. At the end of such process, namely, after the strong physical bond between the frame and each lead is created, the portion interconnecting the leads may be sheared off so that the leads are electrically insulated from one another.

Figure 5:
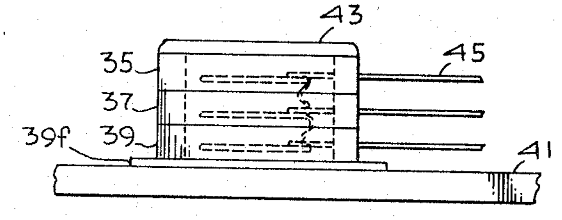
FIGURE 5 is a front view of an arrangement in which a plurality of housings of the present invention are incorporated.

The novel structure of the housing of the invention particularly adapts it to be used in a stacked arrangement. In such an arrangement, a plurality of housing each encasing a different miniature circuit are stacked in a columnar arrangement so that the various circuits may be directly interconnected to one another as well as to the leads protruding through each housing. Reference is now made to FIGURE 5 wherein three housings or frames 35, 37 and 39 are shown stacked on top of one another. Since the frames are metallic, they can be soldered to one another to provide sufficient structural rigidity. The bottom frame 39 shown having a flange **39*f* is coupled to a support member such as a circuit board 41. The top frame 35 is covered by a cover plate 43** which if metallic can be soldered or welded to the top frame.

The leads 45 protruding through each frame are used to connect the circuit encased within the frame to external circuitry. However, since frame 37 is opened at the top and bottom, the circuits within the three frames may also be directly coupled to one another. The entire structure is quite rigid since most of the external surface thereof is metallic. In addition, the metallic surfaces with the glass seals fused thereto provide a hermetically sealed housing within which the miniature circuits are housed. Thus, the circuits may be subjected to severe physical environments without adverse effects.

Figure 6:
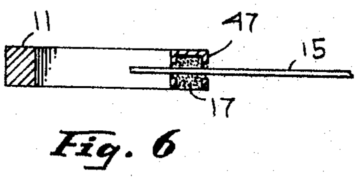
FIGURE 6 is a side view across another embodiment of the present invention.

In the foregoing description, the structure of the frame 11, in which the insulating material 17 is fused, has been referred to as being C-shaped. However, the improved housing of the invention need not be limited thereto. For example, as seen from FIGURE 6 to which reference is made herein, the insulating material 17 may be encased in a U-shaped structure 47 which forms a part of frame 11. The structure 47 may also be defined as a C-shaped structure with the open side thereof pointing downwardly. In some cases the arrangement shown in FIGURE 5 may be preferred, since in such an arrangement the lead 15 passes through two metallic sides of the structure 47. Similarly the frame 11 may include a substantially L-shaped structure, with the lead protruding through the vertical side of the structure in which the insulating material is encased.

In one actual reduction to practice, a frame of less than 0.500 inch on each side and of a height of less than 0.100 inch was constructed of metal which was finished for easy soldering or spot welding. Leads not thicker than 0.010 inch and spaced 0.050 inch apart, protruded through a C-shaped portion of the frame, wherein a fused glass seal insulated the leads from the frame. After connecting a miniature circuit to the leads, the top and bottom of the frame were covered to form a hermetically sealed housing which withstands thermal shock of 5 cycles from $-197°$ C. liquid nitrogen to $+360°$ C. without any loss in dielectric or vacuum tightness and an electrical insulation of 50,000 megohms. The housing was found to be vacuum tight within $1\times10^{-9}$ cc./second of 1 atmosphere differential helium. The leads could be subjected to strain within the elastic limits of the metal without any adverse effect on the encased miniature circuit.

There has accordingly been described and shown herein a novel and useful structure for enclosing a miniature circuit, within a hermetically sealable housing so as to prevent adverse effects on the circuit from environmental conditions which the circuit would otherwise not be able to withstand. Though the housing has been described in conjunction with a miniature circuit, it should be apparent that it can similarly be used to house a discrete miniature component. Thus, the term miniature circuit should be regarded as including one or more interconnected miniature components or elements.

What is claimed is:

1. A housing for hermetically enclosing a miniature circuit comprising a box-like metallic frame defining a hollow cylinder and having a C-shaped structure on at least one side thereof, the center wall of said C-shaped structure defining the height of said cylinder, said structure having a plurality of openings in the center wall thereof; electrically insulating material fusedly encased and substantially filling said C-shaped structure, to form a vacuum-tight seal thereat; and a plurality of conducting leads each having a portion thereof fusedly encased in said insulating material within said C-shaped structure and electrically insulated from said metallic frame, one end of each lead protruding into the inside of said box-like metallic frame through another of said openings, and the other end of each lead extending from said metallic frame.

2. A housing as recited in claim 1 wherein the open side of said C-shaped structure is outwardly directed so that said insulating material comprises at least a portion of the external periphery of said box-like metallic frame, and the center wall faces the interior of said hollow cylinder.

3. A housing as recited in claim 1 wherein said C-shaped structure extends on two substantially parallel sides of said frame, with the center walls of said C structure defining said parallel sides, with conducting leads extending through said two substantially parallel sides whereby one end of each of a first plurality of leads extends into the inside of said box-like metallic frame through an opening in one of the parallel sides of said C-shaped structure, with the other end thereof extending to the exterior of said frame and one end of each of a second plurality of leads extends from said metallic frame through an opening in the other of the parallel sides of said C-shaped structure.

4. A housing for enclosing a miniature circuit comprising a hollow cylindrically shaped metallic frame of uniform height, at least two portions of said frame being of C-shaped with the open sides of said C-shapes being directed outwardly, and the center sides defining apertures, aligned in directions perpendicular to the height of said frame, the hollow portion of said frame being large enough to house a miniature circuit therein; first and second pluralities of conducting leads; and fusible insulating means fusibly coupling said first plurality of conducting leads to said frame within one of the C-shaped frame portion and said second plurality of conducting leads to said frame within the other C-shaped frame portion, each said conducting leads being electrically insulated from metallic frame and extending through said C-shaped portion with at least part thereof extending into the hollow frame through one of said apertures and another part extending to the exterior of said frame through the open side of said C-shapes.

5. A housing adapted for hermetically enclosing a miniature circuit or the like comprising:

a box-like metallic frame defining a hollow cylinder and having a hollow C-shaped structure on one side thereof, said structure consisting of a center wall, two parallel side walls extending therefrom and two protruding members extending from the opposite ends of side walls into the open side of said structure opposite said center wall, said center wall defining a plurality of apertures;

a plurality of conducting leads extending from the exterior of said frame into the interior thereof through said structure, whereby each lead has one end extend into the interior of said frame and an opposite end extend to the exterior of said frame; and insulating material, fusedly encased in said hollow structure to support said conductors in electrical insulation from said frame, whereby each lead extend through said structure into said frame, with said insulating material hermetically sealing said leads to said frame.

6. The housing as recited in claim 5 wherein the open side of said structure is outwardly directed and said center wall thereof defines an interior wall of said cylinder, whereby each lead has one and extend into the interior of said cylinder through one of said apertures and an opposite end extend to the exterior of said frame through said structure and the open side thereof.

7. The housing as recited in claim 5 wherein said frame has two similar hollow C-shaped structures, with a plurality of leads extending into said hollow cylinder through each of said structures, and being electrically insulated from said frame by the insulating material fusedly encased in said hollow structure.

References Cited by the Examiner

UNITED STATES PATENTS

| | | | |
|---|---|---|---|
| 3,105,868 | 10/1963 | Feigin et al. | 174—68.5 |
| 3,147,402 | 9/1964 | Hochstetler | 174—68.5 X |
| 3,190,952 | 6/1965 | Bitko | 174—52 |

LEWIS H. MYERS, *Primary Examiner.*

D. L. CLAY, *Examiner.*